United States Patent
Hashizume

[11] Patent Number: 5,973,862
[45] Date of Patent: Oct. 26, 1999

[54] OPTICAL MODULE

[75] Inventor: Hideki Hashizume, Kanagawa, Japan

[73] Assignee: Nippon Sheet Glass Company Ltd., Osaka, Japan

[21] Appl. No.: 09/094,774

[22] Filed: Jun. 15, 1998

[30] Foreign Application Priority Data

Jun. 24, 1997 [JP] Japan ................................ 9-183123

[51] Int. Cl.⁶ .............. G02B 7/02; G02B 6/32; G02B 6/36
[52] U.S. Cl. ................ 359/819; 385/35; 385/93
[58] Field of Search ................ 385/33, 35, 74, 385/92, 93; 359/819

[56] References Cited

U.S. PATENT DOCUMENTS

| 3,904,277 | 9/1975 | Phillips et al. ............ 235/472.03 |
| 4,707,067 | 11/1987 | Haberland et al. ............ 385/90 |
| 5,333,224 | 7/1994 | Kimihiro ................ 385/93 |

FOREIGN PATENT DOCUMENTS

| 0 620 460 | 10/1994 | European Pat. Off. . |
| 34 29 282 | 4/1985 | Germany . |
| 40 22 076 | 1/1992 | Germany . |

OTHER PUBLICATIONS

Patent Abstracts of Japan, vo. 012, No. 394 (P–773), Oct. 20, 1988 & JP 63 136010 A (Fujitsu Ltd.), Jun. 8, 1988.
Patent Abstracts of Japan, vol. 012, No. 342 (E–658), Sep. 14, 1988 & JP 63 102543 A (Ricoh Co. Ltd), May 7, 1988.

Primary Examiner—Georgia Epps
Assistant Examiner—Suzanne Letendre
Attorney, Agent, or Firm—Merchant & Gould

[57] ABSTRACT

An optical module includes a resin housing having an optical axis, a semiconductor device held in the resin housing in alignment with the optical axis, and a lens held in the resin housing in alignment with the optical axis. The resin housing includes a lens holder disposed in facing relation to the semiconductor device. The lens holder has a lens grip member disposed around the optical axis and projecting toward the semiconductor device. The lens grip member has a distal end projecting radially inwardly. The lens holder also has a lens seat at a proximal end of the lens grip member. The lens grip member and the lens seat are integrally molded with the resin housing. The lens is held by the lens seat and gripped by the lens grip member after the lens is forced past the lens grip member toward the lens seat. The lens grip member comprises three lens grip fingers circumferentially spaced at equal angular intervals.

6 Claims, 2 Drawing Sheets

OPTICAL MODULE

BACKGROUND OF THE INVENTION

1. Field of the Invention

The present invention relates to an optical module having a semiconductor light-emitting or -detecting device and a lens which are centrally aligned and held by a resin housing, and more particularly to an optical module in which a lens is fixedly held by lens grip fingers and a lens seat which are integrally molded with a resin housing.

2. Description of the Prior Art

Optical modules have a semiconductor device, such as a semiconductor light-emitting device such as a semiconductor laser or the like, or a semiconductor light-detecting device such as a photodiode, and a lens which are held in central alignment with each other, and are used in the field of optical communications. For example, a computer system used for data communications has a semiconductor light-emitting device module and a semiconductor light-detecting device module which are installed as a module pair on a board. An optical module comprises a semiconductor device, a lens, and a housing which holds the semiconductor device and the lens and also fittingly holds the ferrule of an optical plug from the party to communicate with. When the optical plug is connected to the optical module, the semiconductor device is optically coupled through the lens to an optical fiber held by the ferrule. The housing generally comprises a holder which holds the semiconductor device and the lens and a receptacle which fittingly holds the ferrule. The holder and the receptacle are manufactured as separate members and fixed in central alignment with each other.

The lens incorporated in an optical module generally comprises a spherical lens or a gradient-index rod lens. The lens may also comprise any of various other lenses. Of those different lenses, the spherical lens is widely used because it is inexpensive as it can easily be manufactured highly accurately by mechanical machining only and it is easy to assemble in position as it has no directivity at all and does not need to be adjusted in orientation for installation. The lens may be fixed to the holder in any of various different ways. According to one process, the lens is put into and positioned in a recess in the holder (lens mount), after which a resin-base adhesive is coated around the lens and then thermoset. According to another process, a molded glass ring of low melting point which is slightly greater than the outside diameter of the lens is placed around the lens, and then melted with heat.

In the former process, since the liquid resin-base adhesive needs to be poured into a small region around the lens, it cannot easily be handled before thermoset. Inasmuch as the holder is usually made of a metal material, the bonded surface of the lens may crack with heat due to the difference between the coefficients of thermal expansion of the lens and the holder.

The latter process also suffers disadvantages in that the glass of low melting point tends to be devitrified and the bonding strength tends to be lowered when left to stand at high temperatures, and the cost is high. Because the molded glass ring of low melting point is produced by molding a powder of glass of low melting point under pressure, when the molded glass ring is placed in position, it scatters fine fragments and particles, which are applied to the surface of the glass. If the molded glass ring is melted with heat in order to fix the lens in place, the fine fragments and particles applied to the surface of the glass are also melted, and the melted glass itself flows around the lens, producing a localized film of glass on the surface of the lens. The glass of low melting point is not resistant to humidity, and is liable to be devitrified with time. If the glass on the surface of the lens is devitrified, then it will cause a reduction in the intensity of light passing through the lens. When exposed to humidity, fine cracks are developed in the glass on the lens, making the glass brittle. Therefore, the bonding strength of the glass is lowered possibly to the point where the lens may be dislodged. This shortcoming could be avoided by employing a countermeasure to make the glass resistant to humidity. Such a countermeasure, together with the fact that the molded glass ring of low melting point is relatively expensive, increases the cost of the optical module.

SUMMARY OF THE INVENTION

It is therefore an object of the present invention to provide an optical module which has a lens that can quickly and easily be fixed to a housing without the need for a resin-base adhesive and fusible glass, and which is highly weatherable and reliable, and can be manufactured inexpensively.

According to the present invention, an optical module comprises a resin housing having an optical axis, a semiconductor device held in the resin housing in alignment with the optical axis, and a lens held in the resin housing in alignment with the optical axis. Specifically, an optical module comprises a resin housing having an optical axis, for fittingly holding a ferrule of an optical plug to be coupled thereto, a semiconductor device held in the resin housing in alignment with the optical axis, and a lens held in the resin housing in alignment with the optical axis, for optically coupling the semiconductor device to an optical fiber held by the ferrule when the optical plug is coupled to the resin housing. The resin housing includes a lens holder disposed in facing relation to the semiconductor device. The lens holder has a lens grip member disposed around the optical axis and projecting toward the semiconductor device. The lens grip member has a distal end projecting radially inwardly. The lens holder also has a lens seat at a proximal end of the lens grip member. The lens grip member and the lens seat are integrally molded with the resin housing. The lens is held by the lens seat and gripped by the lens grip member after the lens is forced past the lens grip member toward the lens seat.

The lens grip member comprises a plurality of, e.g., three, lens grip fingers circumferentially spaced at equal angular intervals.

The lens comprises a spherical lens, said lens seat being substantially complementary in shape to a portion of an outer spherical surface of said spherical lens.

The resin housing is made of a liquid crystal polymer in which glass beads having an average diameter of at most 30 $\mu$m are dispersed.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 1:
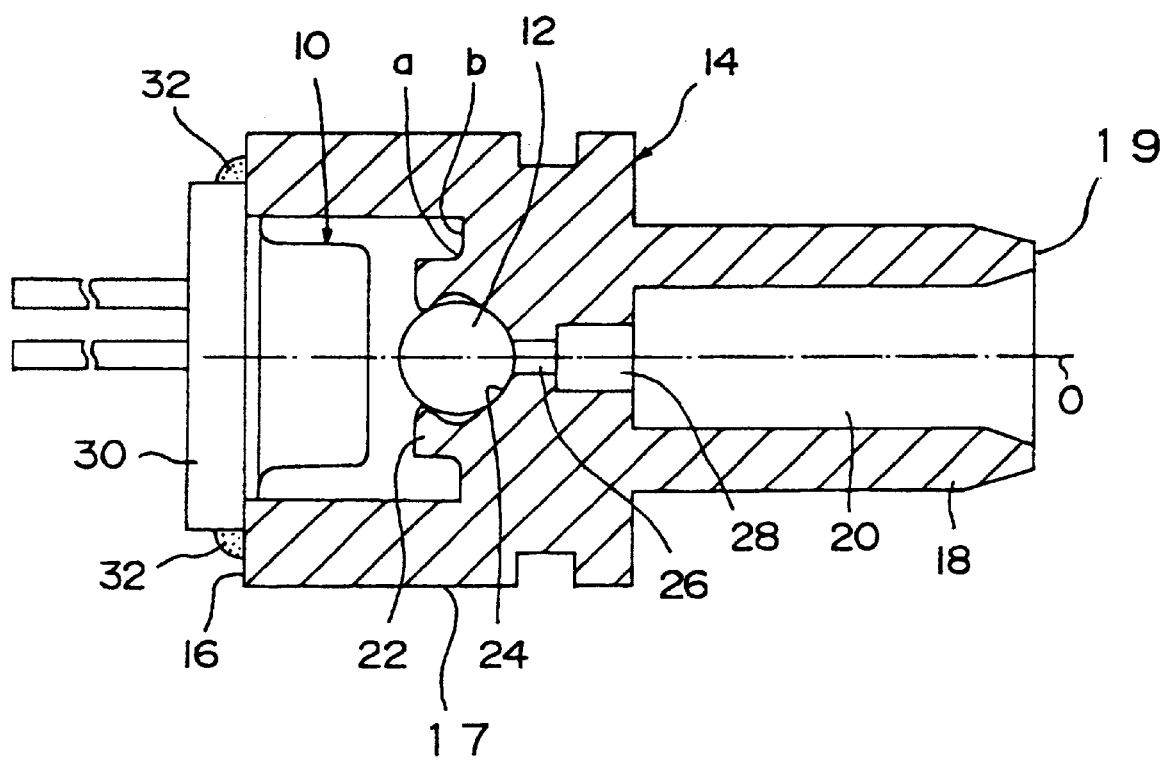
FIG. 1 is a longitudinal cross-sectional view of an optical module according to the present invention.
Figure 2:
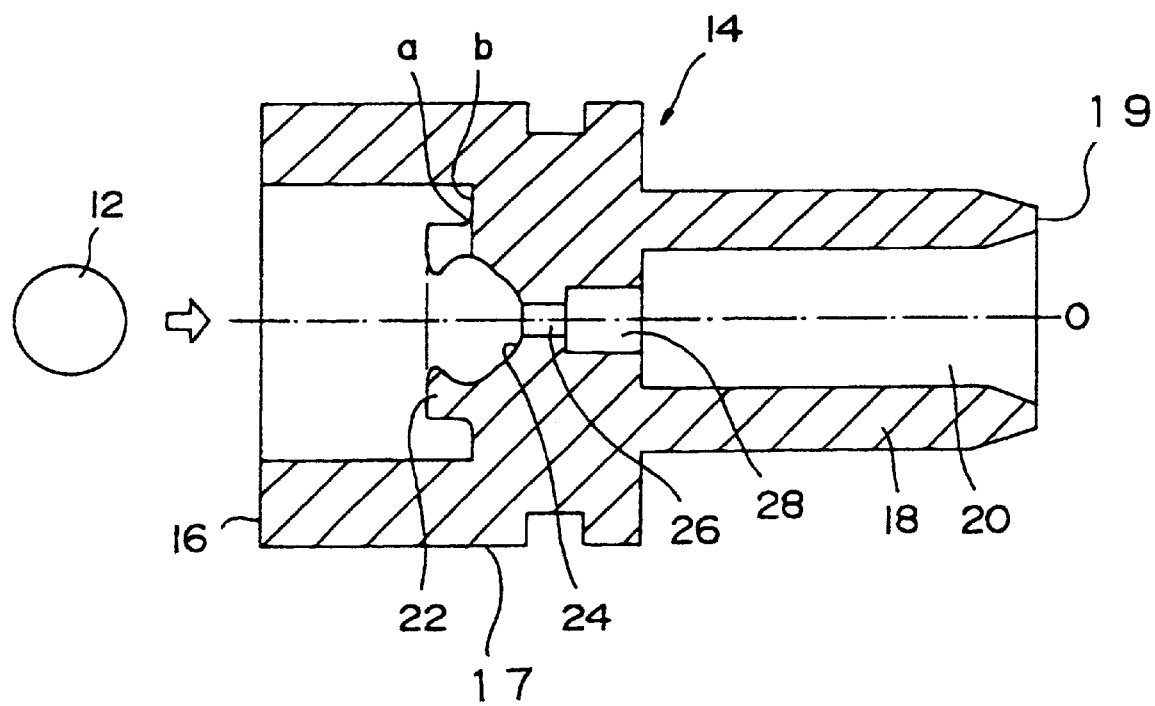
FIG. 2 is a longitudinal cross-sectional view of the optical module prior to the mounting of a spherical lens in a resin housing.
Figure 3:
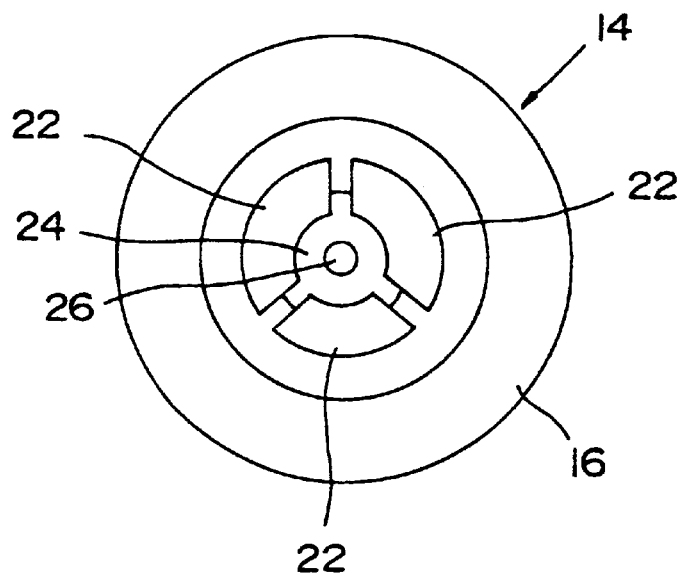
FIG. 3 is an end view of the resin housing, showing lens grip fingers and a lens seat thereof.

As shown in FIGS. 1 through 3, an optical module according to the present invention comprises a semiconductor device 10, a spherical lens 12, and a resin housing 14 holding the semiconductor device 10 and a spherical lens 12. The ferrule of an optical plug (not shown) from the party to communicate with can be fitted and held in the resin housing 14. When the optical plug is coupled to the optical module, the semiconductor device 10 is optically coupled through the spherical lens 12 to an optical fiber held by the ferrule.

The semiconductor device 10 may comprise a light-emitting device such as a semiconductor laser or a light-emitting diode, or a light-detecting device such as a photodiode or a photodiode with a built-in preamplifier.

The resin housing 4 is of a substantially cylindrical molded unitary structure, and has an end 16, a right-hand end as viewed in FIGS. 1 and 2, on which the semiconductor device 10 is mounted, a lens holder 17 extending from the end 16 and holding the spherical lens 12 therein, and a receptacle 18 extending from the middle region 17 away from the end 16 toward an opposite end 19. The receptacle 18 has a bore 20 defined therein for receiving the ferrule of the optical plug to be coupled to the optical module. The optical module has a central optical axis O extending coaxially through the semiconductor device 10, the lens 12, and the receptacle 18.

The lens holder 17 has a plurality of radial lens grip fingers 22 disposed around the optical axis O and projecting axially toward the semiconductor device 10. The lens grip fingers 22 have their distal ends projecting or overhanging slightly radially inwardly. The lens holder 17 also has a spherically concave lens seat 24 positioned at the proximal ends of the lens grip fingers 22. In the illustrated embodiment, there are three lens grip fingers 22 that are circumferentially spaced at equal angular intervals. The spherically concave lens seat 24 is substantially complementary in shape to a portion of the outer spherical surface of the spherical lens 12 so that the spherical lens 12 can fit snugly in the spherically concave lens seat 24. The lens holder 17 also has a small-diameter hole 26 and a large-diameter hole 28 that are successively defined coaxially therein. These holes 26, 28 communicate with the spherically concave lens seat 24 and the bore 20 and serve as a light beam passage.

The lens grip fingers 22 are integrally molded when the resin housing 14 is injection-molded. The lens grip fingers 22 are molded as follows: Recesses are defined at the base of a spherical end of a core pin that is inserted into the center of a mold assembly for injection-molding the resin housing 14. Immediately after a resin material is injected into the mold assembly, the core pin is pulled out.

The lens grip fingers 22 have outer surfaces whose proximal ends "a" are rounded. An annular recess "b" defined around the lens grip fingers 22 extend axially to a position which corresponds to the center of the spherical lens 12 held by the lens holder 17. When the spherical lens 12 is forced into the lens holder 17, the lens grip fingers 22 with the rounded proximal ends "a" are mechanically strong when they are resiliently deformed radially outwardly as the spherical lens 12 moves axially toward the lens seat 24 and can reliably spring back radially inwardly after the spherical lens 12 is seated on the lens seat 24. However, the proximal ends "a" and the annular recess "b" may not be shaped as described above depending on the nature of the resin material used and the dimensions of the lens grip fingers 22.

The resin housing 14 should preferably be made of a resin material having high tenacity for allowing the lens 12 to be forced easily into the lens holder 17 and reliably holding the lens 12, and having a small coefficient of linear expansion, e.g., about $2 \times 10^{-5}/°C.$, in order to keep the dimensions of the receptacle 18 within a tolerance of about $5/1000$ mm in a temperature range from $-20°$ C. to $+75°$ C. Under certain temperature conditions, however, the resin material may have a coefficient of linear expansion up to about $8 \times 10^{-5}/°$ C. Resin materials which satisfy the above requirements are called engineering plastics, and may include liquid crystal polymers (LCP), polyetheretherketone (PEEK), polyetherimide, polyphenylsulfide (PPS), polybutylene terephthalate (PBT), polyphenylene ether (PPE), polycarbonate (PC), and polyamide. If the coefficient of linear expansion is too large, a suitable amount of a glass filler or glass beads may be mixed with the resin material. The glass beads should preferably have an average diameter of at most about 30 μm. Though the average diameter should preferably be smaller, glass beads of smaller average diameters are more expensive. A liquid crystal polymer with glass beads having an average diameter ranging from 2 to 20 μm is most preferable.

In an experiment, the resin material of the resin housing 14 was a liquid crystal polymer of low anisotropy in which 50 wt % of glass beads having an average diameter of about 20 μm are dispersed. While the liquid crystal polymer itself had large anisotropy with respect to its coefficient of linear expansion (the coefficient of linear expansion is essentially nil in the direction in which the resin material flows when the resin housing 14 is injection-molded, and the coefficient of linear expansion is $8 \times 10^{-5}/°$ C. in a direction normal to that direction), the anisotropy was reduced by the dispersed glass beads. With the above resin material used, changes in the inside diameter of 2.5 mm of the receptacle 18 were reduced to 0.005 mm in the actual temperature range ($-20°$ C. to $+75°$ C.) in which the optical module was used.

The spherical lens 12 is fixed in position as follows: The resin housing 14 is erected with the end 16 facing up, and the spherical lens 12 is placed onto the distal ends of the lens grip fingers 22. Then, the spherical lens 12 is pressed along the lens grip fingers 22 toward the lens seat 24 by a rod-shaped pressing jig (not shown). As the spherical lens 12 is pressed, the lens grip fingers 22 flexes radially outwardly resiliently de to their tecacity. When the spherical lens 12 is seated and positioned on the lens seat 24, the lens grip fingers 22 spring back radially inwardly under resilient forces. The spherical lens 12 is now gripped by the lens grip fingers 22 and held on the lens seat 24. Because the spherical lens 22 is thus securely fixed in position by the lens grip fingers 22 and the lens seat 24, the spherical lens 22 remains reliably held in position under retentive forces from the resin housing 14 even when the resin housing 14 slightly expands as the temperature rises. In an experiment, when the spherical lens 22 was forcibly removed from the lens seat 24 and the lens grip fingers 22 by a tool inserted through the bore 20, the applied force ranged from 15 to 20 kgf. Because of highly accurate agreement between the radii of curvature of the lens seat 24 and the spherical lens 12, the accuracy with which the spherical lens 12 was positioned with respect to the optical axis O was held to ±0.01 mm as a deviation from a designed value. From an optical design standpoint, the distance from a point of laser beam emission to the surface of the spherical lens 12 is an important factor, and variations of optical characteristics of the optical module can be reduced by accurately controlling such distance.

After the spherical lens 12 is accommodated in the resin housing 14, the semiconductor device 10 is coupled to the resin housing 14. The semiconductor device 10 has a hermetically sealed package which houses various components thereof. The semiconductor device 10 has a base 30 which is held against the end 16 when the hermetically sealed package is inserted in the resin housing 14. After the semiconductor device 10 is axially aligned with the resin housing 14, the base 30 is bonded to the end 16 by a resin-base adhesive 32.

When the optical plug is coupled to the optical module, the ferrule of the optical plug is fitted in the receptacle 18. If the semiconductor device 10 is a semiconductor laser, for example, then a laser beam emitted thereby is converged and optically aligned by the spherical lens 12 so as to be focused onto the end face of the optical fiber in the bore 20. The small-diameter hole 26 communicating with the center of the lens seat 24 has its diameter selected to be a minimum diameter required to pass only a laser beam to be transmitted to the optical fiber while removing unwanted light produced by aberrations of the spherical lens 12. If the semiconductor device 10 is a photodiode, for example, then when the optical plug is coupled to the optical module, light emitted from the end face of the optical fiber in the bore 20 is converged and optically aligned by the spherical lens 12 so as to be applied to the photodiode.

In the above embodiment, the resin housing includes the receptacle integrally formed therewith. However, a resin housing may not have an integrally formed receptacle. Such a receptacle-free resin housing may be used as it is, or a separate receptacle may be joined to such a receptacle-free resin housing. If such a separate receptacle is used, it may be made of a material which is highly durable against repeated insertion and removal of the ferrule of an optical fiber.

Since the lens holder composed of the lens grip fingers and the lens seat is integrally molded with the resin housing, the number of parts of the optical module is minimized. Furthermore, because the lens can mechanically be fixed to the resin housing without an adhesive or fusible glass, no adhesive will be applied to the surface of the lens, and the optical module has increased weatherability. The lens can easily be handled because it can be fixed in position simply by being placed in the resin housing and pressed in by a pressing jig. As a result, no other special parts are required to fix the lens in position, and the cost of installation of the lens is low. Consequently, the optical module according to the present invention can be manufactured relatively inexpensively.

Although a certain preferred embodiment of the present invention have been shown and described in detail, it should be understood that various changes and modifications may be made therein without departing from the scope of the appended claims.

What is claimed is:

1. An optical module comprising:

a resin housing having an optical axis;

a semiconductor device held in said resin housing in alignment with said optical axis; and a lens held in said resin housing in alignment with said optical axis;

said resin housing including a lens holder disposed in facing relation to said semiconductor device, said lens holder having a lens grip member disposed around said optical axis and projecting toward said semiconductor device, said lens grip member having a distal end projecting radially inwardly, said lens holder also having a lens seat at a proximal end of said lens grip member, said lens grip member and said lens seat being integrally molded with said resin housing, said lens being held by said lens seat and gripped by said lens grip member after said lens is forced past said lens grip member toward said lens seat.

2. An optical module according to claim 1, wherein said lens grip member comprises a plurality of lens grip fingers circumferentially spaced at equal angular intervals.

3. An optical module according to claim 1, wherein said lens grip member comprises three lens grip fingers circumferentially spaced at equal angular intervals.

4. An optical module according to claim 1, wherein said lens comprises a spherical lens, said lens seat being substantially complementary in shape to a portion of an outer spherical surface of said spherical lens.

5. An optical module according to claim 1, wherein said resin housing is made of a liquid crystal polymer in which glass beads having an average diameter of at most 30 $\mu$m are dispersed.

6. An optical module comprising:

a resin housing having an optical axis, for fittingly holding a ferrule of an optical plug to be coupled thereto;

a semiconductor device held in said resin housing in alignment with said optical axis; and a lens held in said resin housing in alignment with said optical axis, for optically coupling said semiconductor device to an optical fiber held by the ferrule when the optical plug is coupled to said resin housing;

said resin housing including a lens holder disposed in facing relation to said semiconductor device, said lens holder having a lens grip member disposed around said optical axis and projecting toward said semiconductor device, said lens grip member having a distal end projecting radially inwardly, said lens holder also having a lens seat at a proximal end of said lens grip member, said lens grip member and said lens seat being integrally molded with said resin housing, said lens being held by said lens seat and gripped by said lens grip member after said lens is forced past said lens grip member toward said lens seat.

\* \* \* \* \*